(12) United States Patent
Sugiura et al.

(10) Patent No.: US 6,687,988 B1
(45) Date of Patent: Feb. 10, 2004

(54) METHOD FOR FORMING PIN-FORM WIRES AND THE LIKE

(75) Inventors: Kazuo Sugiura, Akishima (JP); Hirofumi Moroe, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 255 days.

(21) Appl. No.: 09/692,667

(22) Filed: Oct. 20, 2000

(30) Foreign Application Priority Data

Oct. 20, 1999 (JP) .............................. 11-298138

(51) Int. Cl.[7] .......................... H05K 3/00; B23K 1/06; B23K 31/00
(52) U.S. Cl. ......................... 29/843; 228/1.1; 228/4.5; 228/110.1; 228/180.5
(58) Field of Search ............... 228/180.5, 4.5, 228/1.1, 110.1; 29/843

(56) References Cited

U.S. PATENT DOCUMENTS 4,955,523 A  *  9/1990  Carlomagno et al. .... 219/56.21
5,195,237 A  *  3/1993  Cray et al. .................... 29/413
5,897,049 A  *  4/1999  Nakamura et al. ....... 219/56.22

FOREIGN PATENT DOCUMENTS

JP        H10-135220        5/1998

* cited by examiner

Primary Examiner—Allan N. Shoap
Assistant Examiner—Isaac Hamilton
(74) Attorney, Agent, or Firm—Koda & Androlia

(57) ABSTRACT

So as to form pin-form wires or bumps in wire bonding for, for instance, semiconductor devices, the length of a wire (or the tail length) extending from the lower end of a capillary is set longer than the wire length required for forming the ball that is formed in the next step, then the ball is formed on the tip end of the wire, notches are formed in the wire located between the ball and the capillary by a pair of cutters, the ball is bonded to, for instance, an electrode pad, and then the wire is pulled away from the electrode pad so as to cut the wire from the area where the notches are formed.

4 Claims, 2 Drawing Sheets

METHOD FOR FORMING PIN-FORM WIRES AND THE LIKE

BACKGROUND OF THE INVENTION

1. Field of the Invention

The present invention relates to a method for forming pin-form wires or bumps.

2. Prior Art

Pin-form wires and bumps are generally distinguished according to the presence or absence of wire or to the length of wire remaining on the ball bonded to the electrode pad of an electronic circuit element, etc. However, this distinction is not very strict. In the following description, cases in which the length of the wire described above is long, e.g., 100 to 500 $\mu$m, will generally be referred to as pin-form wires, while cases in which the length of the above-described wire is shorter than this will be referred to bumps.

Conventional method for forming pin-form wires or bumps is disclosed in, for example, the Japanese Patent Application Laid-Open (Kokai) H10-135220. The title of this prior art is "A Bump Forming Method." However, this prior art shows a wire that has a certain length and is formed on the ball which is bonded to the electrode pad of an electronic circuit element, etc. Accordingly, this method can be viewed as a method for forming a pin-form wire.

In this prior art, a ball is formed on the tip end of a wire that passes through a capillary, and this ball is bonded to the electrode pad of an electronic circuit element, etc., using the capillary. Then, the capillary is raised for a predetermined amount, and the wire is cut at the lower end of the capillary at a position that is sufficiently away from the ball, so that a pin-form wire or bump is formed. Cutting of the wire in this prior art is performed by one of the methods described below:

In the first method, an electric discharge is applied to the wire, that is located at the capillary hole tip, by means of a discharge electrode installed on the side of the capillary.

In the second method, laser beam is irradiated to the wire, that is at the capillary hole tip end, by means of a laser installed on one side of the lower end of the capillary.

In the third method, air is blown to the wire, that is at the capillary hole tip end, by means of an air nozzle installed on one side of the tip end of the capillary.

In the fourth method, a capillary that is formed by a plurality of chucking pieces which are capable of clamping down on the wire and then releasing the wire, or a capillary that has a chucking means only at its tip end portion, is used; and notches are formed on the wire, that is at the capillary hole tip end, by the edge of the capillary, and then a tensile force is applied to the wire so as to cut the wire.

In the fifth method, a cutter is positioned on one side of the capillary, and the cutter is pressed against the wire, that is at the capillary hole tip end, thus cutting the wire.

In the sixth method, strained portions are formed by notches, press grooves, etc. beforehand at equal intervals along the direction of the length of the wire that is passed through the capillary, and the wire is cut by applying a tensile force to the wire.

In the above-described first method, the cutting of the wire is accomplished by causing an electrical discharge on the wire that is at the capillary hole tip end. Accordingly, the wire is melted by the discharge, and the molten wire rises into the capillary hole, resulting in that the capillary hole is clogged.

In the above-described second, third and fifth methods, it is difficult to install a laser device, an air nozzle and a cutter in the area that has extremely short wire length of, for example, 500 $\mu$m or less, between the ball that is bonded to the electrode pad and the capillary that is in a raised position. Accordingly, such methods are not realized unless there is a certain length of wire present between the ball and the capillary. Furthermore, in cases where numerous pin-form wires or bumps are formed in a dense concentration on an electronic circuit element, etc., the cutting means such as a laser device, air nozzle or cutter contacts the pin-form wires or bumps. Thus, such cutting means cannot be installed.

In the above-described fourth method, the capillary is formed as chucking pieces or has a chucking part that can be freely opened and closed. In this method, however, since in the case of in ultrasonic bonding the structure of the capillary affects the bondability, it is difficult to form a capillary of a chucking structure. Thus, the fourth method that uses capillaries is impractical.

In the above-described sixth method, it is necessary to form strained portions at equal intervals in the wire beforehand in the wire manufacturing process. Accordingly, there are an increased number of processes required for wire manufacture, and material costs are increased. Furthermore, the diameter of the wire is generally extremely small and as slender as, for instance, 20 to 50 $\mu$m, and since back tension is applied to the portion of the wire located between the capillary and the spool on which the wire is wound, there is a danger that arbitrary strained portions of wire between the spool and the capillary might be twisted by this back tension, and the wire is cut as a result of this strain and other reasons. Moreover, the length of the wire allowed above the bonded ball is limited.

SUMMARY OF THE INVENTION

Accordingly, the object of the present invention is to provide a method for forming pin-form wires and the like (bumps) which makes it possible to set the length of the wire above the ball bonded to an electronic circuit element, etc. for any desired length and which involves no cost increase.

The above object is accomplished by a unique process of the present invention used in a method for forming pin-form wires and the like, in which: a ball is formed on the tip end of a wire passed through a capillary of a wire bonding apparatus, the ball is bonded to the electrode pad of an electronic circuit element, etc., using the capillary, the capillary is raised by a fixed amount, and a pin-form wire, etc. is formed by cutting the portion of the wire located above the ball; and in the present invention, the length of the wire extending from the lower end of the capillary is set longer than the wire length required for forming the ball that is formed in the next step, a ball is formed on the tip end of the wire, notches are formed in the portion of the wire located between the ball and the capillary by means of cutters provided in the wire bonding apparatus, the ball is bonded to the electrode pad, and the wire is pulled upward so that the wire is cut from the area of the notches.

The above object is accomplished by another unique process of the present invention used in a method for forming pin-form wires and the like, in which a ball is formed on the tip end of a wire passed through a capillary of a wire bonding apparatus, the ball is bonded to the electrode pad of an electronic circuit element, etc., using the capillary, the capillary is raised by a fixed amount, and a pin-form wire, etc. is formed by cutting the portion of the wire located above the ball; and in the present invention, the length of the wire extending from the lower end of the capillary is set longer than the wire length required for forming the ball that is formed in a later step, notches are formed in the portion of the wire located between the ball and the capillary by means of cutters provided in the wire bonding apparatus, a ball is formed on the tip end of the wire, the ball is bonded to the electrode pad, and the wire is pulled upward so that the wire is cut from the area of the notches.

DETAILED DESCRIPTION OF THE PREFERRED EMBODIMENTS

One embodiment of the present invention will be described with reference to FIG. 1.

Figure 1:
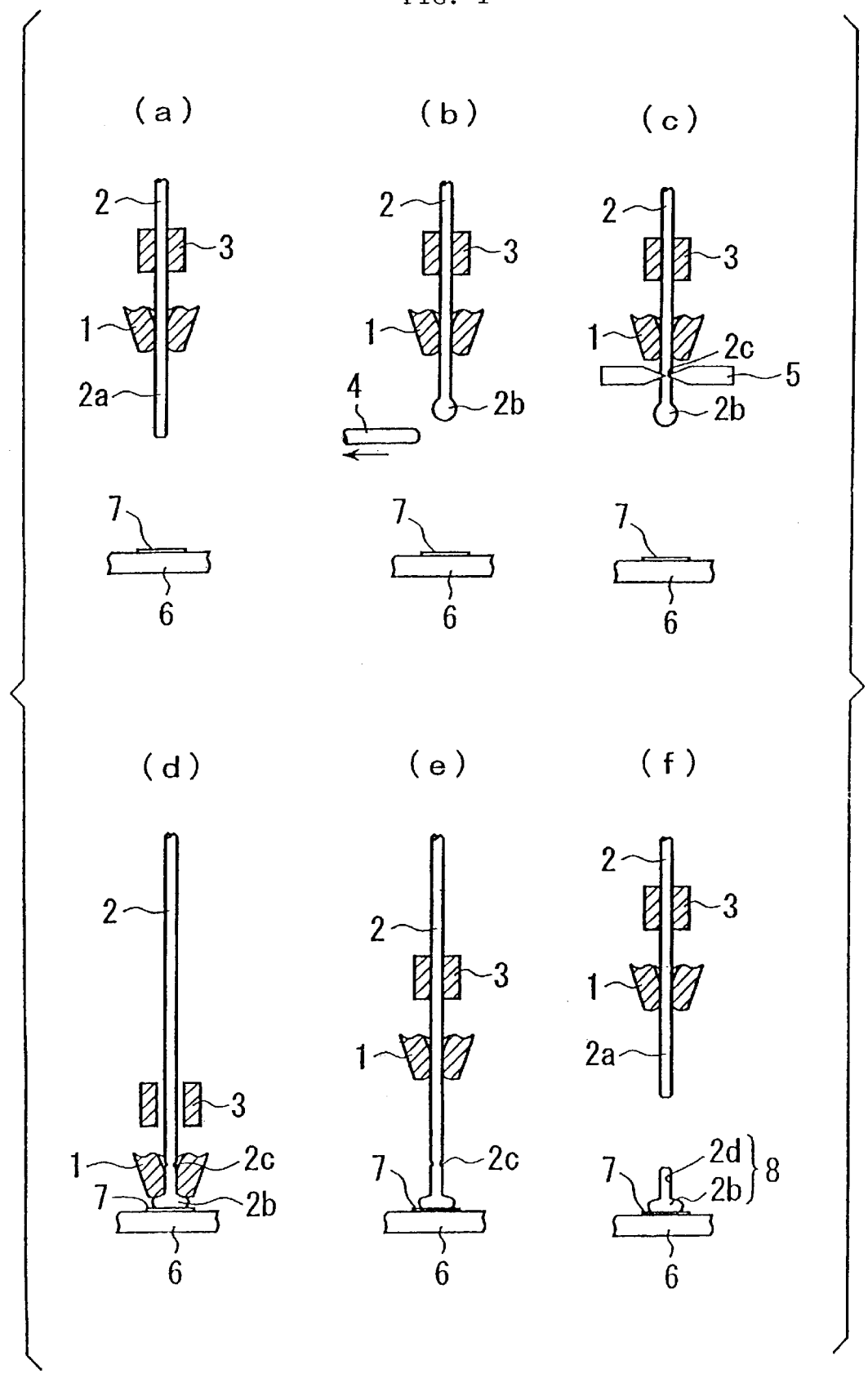
FIG. 1 shows the steps taken in the process according to one embodiment of the method of the present invention for forming pin-form wires and the like (bumps)

As shown in FIG. 1, in step (a), a wire 2 is passed through a capillary 1. The wire length (tail length) 2a extending from the lower end of the capillary 1 is longer than the length of wire required for the formation of the ball that is formed in the following step. In this state, the wire clamper 3 remains closed.

In step (b), a ball 2b is formed on the tip end of the tail length 2a by the discharge of an electric torch 4. Afterward, the electric torch 4 is moved in the direction indicated by the arrow.

Figure 2A:
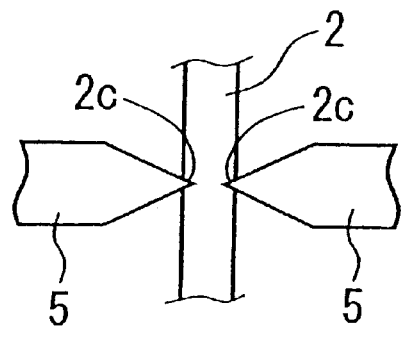
FIG. 2(a) is an enlarged view of part of the wire shown in step (c) of FIG. 1.
Figure 2B:
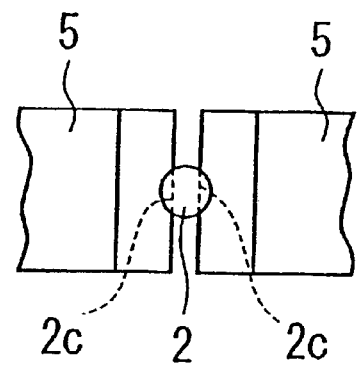
FIG. 2(b) is a plan view thereof.

Next, in step (c), pair of cutters 5 installed on a wire bonding apparatus (not shown) perform a reciprocating movement and form notches 2c that cut into the wire 2. In this case, the cutters 5 contact the wire from opposite directions and bite into the wire by more or less the equal amount. Thus, the notches 2c are formed in approximately equal sizes in opposite positions on the wire 2 as seen from FIG. 2(a).

After the cutters 5 are withdrawn, the wire damper 3 is opened, the capillary 1 and wire damper 3 are both lowered, and the ball 2b is pressed against the electrode pad 7 of an electronic circuit element 6 such as an IC, LSI, etc. in step (d). Next, an ultrasonic vibration is applied to the capillary 1, so that the ball 2b is bonded to the electrode pad 7.

Then, in step (e), the capillary 1 and wire damper 3 are both raised (or moved in a direction opposite from the bonded ball 2b), and the wire damper 3 is closed at an intermediate point in this raising process.

Figure 3A:
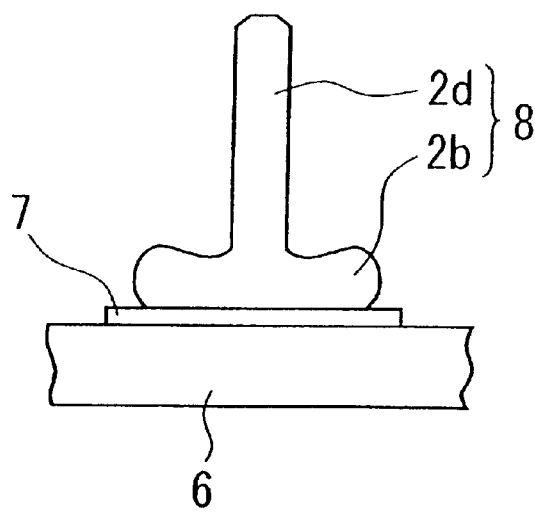
FIG. 3(a) is an enlarged view of the wire and electronic circuit element shown in the step (f) of FIG. 1.
Figure 3B:
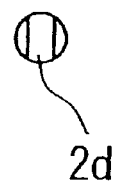
FIG. 3(b) is a plan view of the tip end of the pin-form wire.

Consequently, in the next step (f), the wire 2 is cut from the area of the notches 2c or cut at the notches 2c shown in step (e). Since these notches 2c are formed with approximately equal sizes in opposite positions on the wire 2, the cut surface is uniform as shown in FIG. 3(a). As a result, a pin-form wire or bump 8 is formed as shown in step (f) of FIG. 1 and in FIGS. 3(a) and 3(b).

As seen from the step (e) in FIG. 1, the timing at which the wire damper 3 is closed is set so that it is closed when the capillary 1 is raised to a point above the notches 2c, and this length above the area of the notches 2 is longer than the length obtained by adding the length of the pin-form wire 2d shown in step (f) to the length of wire used to form the ball 2b shown in step (b). As a result, the tail length 2a can extend from the lower end of the capillary 1 as shown in the step (f).

As seen from the step (c) of FIG. 1, the notches 2c are formed in the wire 2 by the cutters 5 before the capillary 1 is lowered for the purpose of bonding the ball 2b to the electrode pad 7. Accordingly, an extremely large gap can be obtained between the electrode pad 7 and the capillary 1, and as a result, there is no impediment to the installation of the cutters 5. Furthermore, even in cases where the pin-form wires or bumps 8 of the type shown in the step (f) have been formed in a dense concentration, since the cutters 5 operate above the pin-form wires or bumps 8 in a position that is away from the pin-form wires or bumps 8, the cutters do not contact the pin-form wires or bumps 8. As a result, there are no restrictions on the portion of the wire 2 in which the notches 2c are formed, and the notches 2c can be formed at any desired positions. In addition, the wire length 2d can be set at any desired length.

In the above embodiment, the notches 2c are formed after the formation of the ball 2b as shown in steps (b) and (c) in FIG. 1. However, the ball 2b can be formed after the notches 2c are made in the wire 2.

As seen from the above, the present invention relates to a method for forming pin-form wires and the like in which a ball is formed on the tip end of a wire passing through a capillary of a wire bonding apparatus, the ball is bonded to the electrode pad of an electronic circuit element using the capillary, the capillary is raised by a fixed amount, and a pin-form wire (or a bump) is formed by cutting the portion of the wire located above the bonded ball; and in the present invention, the length of the wire extending from the lower end of the capillary is made longer than the wire length required for the ball that is formed in the later step, the a ball is then formed on the tip end of the wire, notches are formed in the portion of the wire located between the ball and the capillary by cutters disposed on the wire bonding apparatus, the ball is then bonded to the electrode pad, and the wire is pulled upward so that the wire is cut from the area of the notches. Accordingly, the wire length above the ball bonded to the electronic circuit element can be set at any desired length, and there is no cost increase.

What is claimed is:

1. A method for forming pin-form wires in which a ball is formed on a tip end of a wire passed trough a capillary of a wire bonding apparatus, said ball is bonded to an electrode pad of an electronic circuit element using said capillary, said capillary is raised by a fixed amount, and said pin-form wire is formed by cutting a portion of said wire located above said ball, said method comprising the ordered steps of:

setting a length of wire extending from a lower end of said capillary longer than a wire length required for forming a ball formed in next step, forming said ball on said tip end of said wire, forming notches in a portion of said wire located between said ball and said capillary by means of cutters provided in said wire bonding apparatus, bonding said ball to said electrode pad, and pulling said wire sword so as to cut said wire at an area of said notches.

2. A method for forming pin-form wires in which a ball is formed on a tip end of a wire passed through a capillary of a wire bonding apparatus, said ball is bonded to an electrode pad of an electronic circuit element using said capillary, said capillary is raised by a fixed amount, and said pin-form wire is formed by cutting a portion of said wire located above said ball, said method comprising the ordered steps of:

setting a length of wire extending from a lower end of said capillary longer than a wire length required for forming a ball formed in a later step, forming notches in a portion of said wire located between said ball and said capillary by means of cutters provided in said wire bonding apparatus, forming said ball on said tip end of said wire, bonding said ball to said electrode pad, and pulling said wire upward so as to cut said wire at an area of said notches.

3. A method for forming pin-form wires in a wire bonding apparatus comprising the ordered steps of:

letting a wire to pass through a capillary and setting a length of a wire extending from a lower end of said capillary to be longer than a wire length required for forming a ball which is formed in next step, forming said ball on a tip end of said wire extending from said lower end of said capillary, forming notches in a portion of said wire located between said ball and said capillary by means of cutters, moving said capillary toward an object on which said pin-form wires are formed and bonding said ball to said object on which said pin-form wires are formed, and pulling said wire in a direction opposite from said ball so as to cut said wire at said notches.

4. The method according to claim 3, wherein said notches are formed in substantially equal sizes in opposite positions on said wire.

* * * * *